(12) United States Patent
Suga

(10) Patent No.: US 7,226,855 B2
(45) Date of Patent: Jun. 5, 2007

(54) SEMICONDUCTOR INTEGRATED CIRCUIT DEVICE HAVING DIAGONAL DIRECTION WIRING AND LAYOUT METHOD THEREFOR

(75) Inventor: Masato Suga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/338,775

(22) Filed: Jan. 25, 2006

(65) Prior Publication Data

US 2006/0118966 A1 Jun. 8, 2006

Related U.S. Application Data

(62) Division of application No. 10/800,659, filed on Mar. 16, 2004, now Pat. No. 7,023,094.

(30) Foreign Application Priority Data

Jun. 25, 2003 (JP) .............................. 2003-181108

(51) Int. Cl.
*H01L 21/4763* (2006.01)
(52) U.S. Cl. ...................................... 438/622; 438/618
(58) Field of Classification Search ................ 438/618, 438/622
See application file for complete search history.

(56) References Cited

U.S. PATENT DOCUMENTS 6,546,540 B1  4/2003  Igarashi et al. ................ 716/13

FOREIGN PATENT DOCUMENTS

JP   2000-082743   3/2000
JP   2001-142931   5/2001

*Primary Examiner*—Long Pham
(74) *Attorney, Agent, or Firm*—Armstrong, Kratz, Quintos, Hanson & Brooks, LLP

(57) ABSTRACT

A semiconductor integrated circuit device having a plurality of circuit elements and a plurality of wires connecting the circuit elements, includes an orthogonal wire having a first minimum wire width which is formed on a first wiring layer and extends horizontally or vertically; a diagonal wire having a second minimum wire width which is substantially equal to the first minimum wire width, formed on a second wiring layer which differs from the first wiring layer and extending in a diagonal direction in relation to the orthogonal wire; and a via having a size which is no greater than the first or second wire width, formed at point at which the orthogonal wire and diagonal wire overlap so as to connect the orthogonal wire and diagonal wire, wherein one of the diagonal wire and orthogonal wire includes an enlarged wire width region in the position at which the via is formed, the wire width of the enlarged wire width region being enlarged beyond the first or second minimum wire width.

4 Claims, 15 Drawing Sheets

16. Grid Points

16. Grid Points

FIG. 3A  PRIOR ART  FIG. 3B
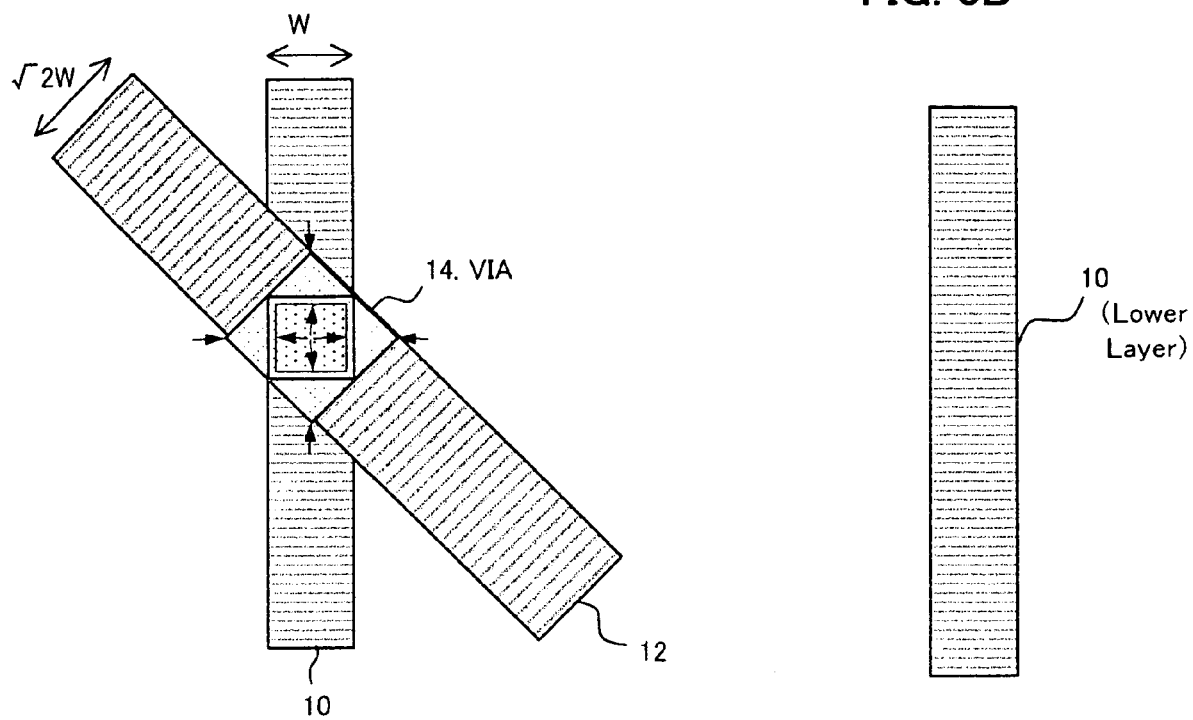
FIG. 3D
FIG. 3C
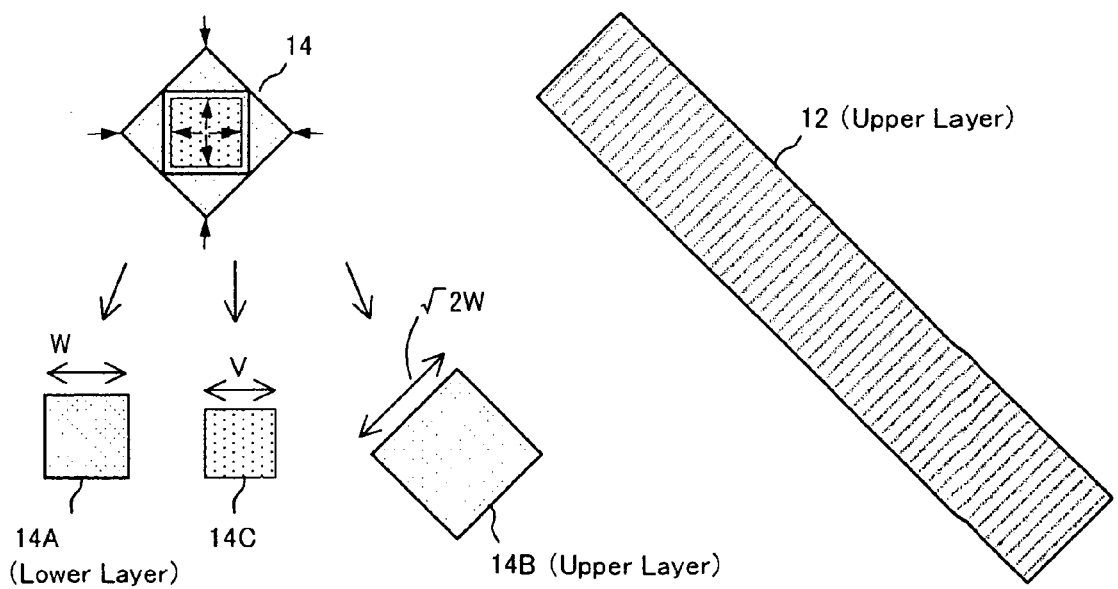

First Embodiment

W=V+2X

First Embodiment
FIG. 5A  $W' = V + 2X = W$
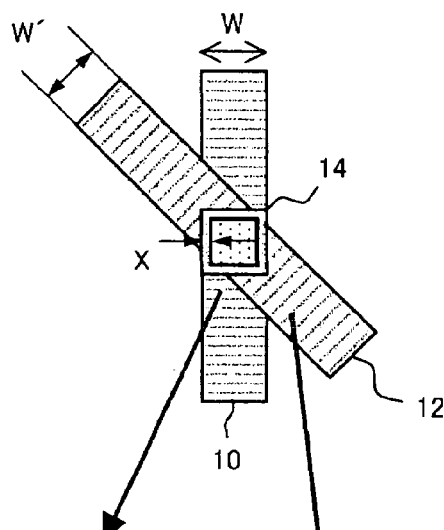
FIG. 5B
Enlarged via figure
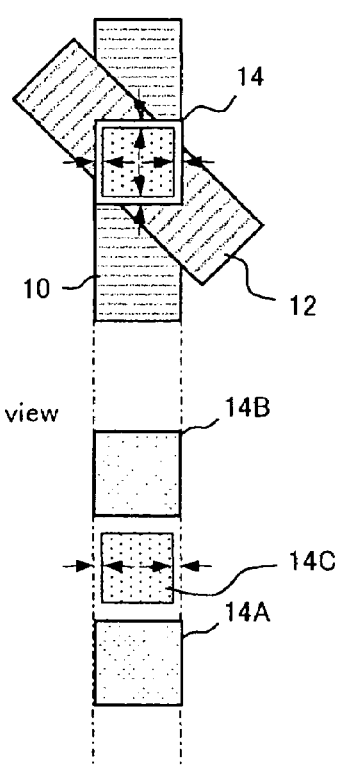
FIG. 5C
Cross sectional view of via figure
FIG. 5D
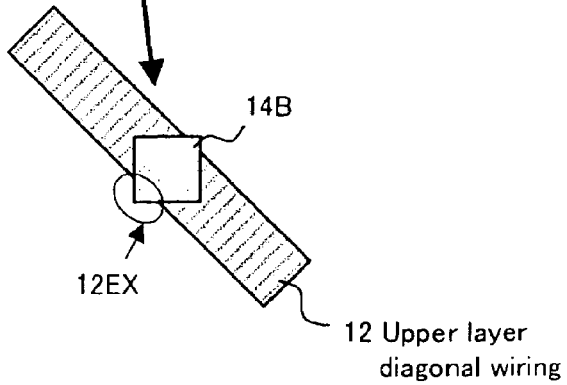
12 Upper layer diagonal wiring

First Embodiment

Via figure

Cross sectional view of via figure

| 20: | ——— | Standard Grid |
| 22: | - - - - - | ½ Grid (Half Grid) |
| 21: | ● | Grid point of standard grid |
| 23: | ○ | ½ grid point of ½ grid |

Second Embodiment (Modification)

| 20: | ——— | Standard Grid |
| 22: | - - - - - | ½ grid (Half Grid) |
| 21: | ● | Grid point of standard grid |
| 23: | ○ | ½ grid point of ½ grid |

SEMICONDUCTOR INTEGRATED CIRCUIT DEVICE HAVING DIAGONAL DIRECTION WIRING AND LAYOUT METHOD THEREFOR

CROSS-REFERENCE TO RELATED APPLICATIONS

This application is a divisional application of U.S. patent application Ser. No. 10/800,659, filed Mar. 16, 2004 now U.S. Pat. No. 7,023,094, which is based upon and claims the benefit of priority from the prior Japanese Patent Application No. 2003-181108, filed on Jun. 25, 2003, the entire contents of which are incorporated herein by reference.

BACKGROUND OF THE INVENTION

1. Field of the Invention

The present invention relates to a semiconductor integrated circuit device having diagonal direction wiring, and a layout method therefor, and more particularly to a semiconductor integrated circuit device and a layout method therefor in which the width of the diagonal direction wiring can be narrowed, thereby enabling an increase in the density of the diagonal direction wiring.

2. Prior Art

A semiconductor integrated circuit device (LSI) is a large-scale circuit constituted by connecting a plurality of circuit elements formed on a semiconductor substrate with wires in a multi-layer wiring layer on the substrate. The number of wires in this multi-layer wiring layer is great, and hence layout of the wires is usually performed automatically using an automatic layout tool controlled by a computer program rather than manually. In the layout performed by this automatic layout tool, wires extending in a vertical direction and a horizontal direction are combined to form connecting wires between the circuit elements.

This automatic layout method is based on a grid architecture and a preferred direction. In the grid architecture, wires are formed in a horizontal direction and vertical direction over a standard grid which is defined at a constant pitch in the horizontal and vertical directions. Hence all of the wires are disposed on the standard grid at intervals of integral multiples of the grid pitch, and, as a result, algorithms for data processing, wire retrieval, and so on can be simplified. A preferred direction, on the other hand, is an architecture in which wires only in a vertical direction are formed on a first wiring layer, and wires only in a horizontal direction are formed on a second wiring layer above or below the first wiring layer. By limiting the wiring directions in each wiring layer, the automatic layout algorithms can be simplified.

In these layout architectures, the wiring is invariably positioned on a grid and connection points connecting the wires of different layers are positioned at grid points, and thus such architectures have the merit of enabling simplification of the automatic layout algorithms.

However, in these architectures, circuit elements are connected only by a combination of wires in a horizontal direction and vertical direction, and hence the wiring tends to increase in length, delay times caused by the wiring configuration increase, and it is sometimes difficult to form a critical pass with severe restrictions on the signal timing. Hence in recent years, an architecture which allows diagonal wiring with a 45° or 135° incline in relation to the standard grid has been proposed, for example in Japanese Unexamined Patent Application Publication 2000-82743, Japanese Unexamined Patent Application Publication 2001-142931, and so on.

By allowing the formation of diagonal wiring, the length of the wires can be reduced, flexibility for the formation of the critical pass can be increased, and the layout capability of automatic layout can be greatly improved.

In Japanese Unexamined Patent Application Publication 2000-82743, the formation of diagonal wiring on a diagonal wiring grid is proposed, whereby in addition to a standard horizontal direction and vertical direction wiring grid, a diagonal wiring grid having a pitch of $\sqrt{2}$ P in relation to the pitch P of the standard wiring grid is provided so that a diagonal wiring is formed on the diagonal wiring grid. According to this method, the grid points on the standard wiring grid and the grid points on the diagonal wiring grid match, and hence vias for connecting different wiring layers can be limited to positions on the grid points, enabling simplification of the automatic layout algorithms.

In Japanese Unexamined Patent Application Publication 2001-142931, a proposal is made to employ a diagonal wiring grid similar to that described above, in which a first conductive layer having the wire width of the horizontal or vertical wires, a second conductive layer having the wire width of the diagonal wires, and a connection pattern comprising vias between the first and second conductive layers are provided at the connection points where the diagonal wires overlap with the horizontal or vertical wires. In other words, it is proposed that the diagonal wire width be set to $\sqrt{2}$ W in relation to the horizontal or vertical wire width W, and accordingly that the via figure be set to the width W on the horizontal or vertical wiring side, and to $\sqrt{2}$ W on the diagonal wiring side.

FIG. 1 is a view showing the example of diagonal wiring proposed in Japanese Unexamined Patent Application Publication 2000-82743, as described above. In the drawing, the dot/dash lines correspond to the standard grid and the diagonal grid. Vertical direction wires 10 are formed on the standard grid, and diagonal wires 12 are formed on the diagonal grid. By setting the pitch of the diagonal grid to $\sqrt{2}$ P in relation to the pitch P of the standard grid, the grid points of the two grids match, and vias 14 can be formed at the matching grid points.

FIG. 2 is a view showing a gridless architecture. In this gridless architecture, the pitch of a grid for diagonal wiring is set to be equal to the pitch P of the standard grid, enabling an increase in the density of the diagonal wires. However, the grid points 16 of the two grids do not match whatsoever, creating complications in the automatic layout algorithms. Such an architecture is impracticable, and hence unfavorable.

SUMMARY OF THE INVENTION

It is an object of the present invention to provide a wiring architecture in which a minimum wire width and minimum pitch similar to those of the horizontal and vertical wires can also be employed for the diagonal wires.

A further object of the present invention is to provide a semiconductor integrated circuit device and a layout method therefor in which the wiring density of the diagonal wires is improved.

In order to achieve the objects described above, a first aspect of the present invention is a semiconductor integrated circuit device having a plurality of circuit elements and a plurality of wires connecting the circuit elements, includes an orthogonal wire having a first minimum wire width which is formed in a first wiring layer and extends horizontally or vertically; a diagonal wire having a second minimum wire width which is substantially equal to the first minimum wire width, formed in a second wiring layer which differs from the first wiring layer and extending in a diagonal direction in relation to the orthogonal wire; and a via having a size which is no greater than the first or second wire width, formed at point at which the orthogonal wire and diagonal wire overlap so as to connect the orthogonal wire and diagonal wire, wherein one of the diagonal wire and orthogonal wire includes an enlarged wire width region in a position at which the via is formed, the wire width of the enlarged wire width region being enlarged beyond the first or second minimum wire width.

According to the first aspect described above, the wire width of the diagonal wire can be made substantially equal to the wire width of the orthogonal wire which extends horizontally or vertically, and thus the wiring density of the diagonal wires can be increased. Moreover, an enlarged wire width region is provided on the diagonal wire (or orthogonal wire) in the position of the via which connects the orthogonal wire and diagonal wire, and hence a sufficient connection margin can be ensured between the via and the diagonal wire, thus enabling the provision of an appropriate connecting via figure.

A second aspect of the present invention for achieving the objects described above is a semiconductor integrated circuit device having a plurality of circuit elements and a plurality of wires connecting these circuit elements, comprising orthogonal wires formed on a standard grid which has a pitch P and extends in a horizontal or vertical direction, and disposed at intervals of at least the pitch P; and diagonal wires inclined by 45° or 135° in relation to the orthogonal wires, wherein the diagonal wires comprise a first diagonal wire formed on a grid point of the standard grid and a second diagonal wire formed on a ½ grid point at which the standard grid intersects a ½ grid which is displaced from the standard grid by P/2, and the first and second diagonal wires are disposed at intervals of at least $(1.5/\sqrt{2}) \times P$ in relation to the pitch P.

According to the second aspect described above, the minimum pitch of the diagonal wires can be set at $1.5/\sqrt{2} \cdot P \approx 1.06$ P, which is approximately equal to the minimum pitch P of the orthogonal wires, and hence the wiring density of the diagonal wires can be increased. Further, the diagonal wires are formed on grid points of the standard grid and ½ grid points at which the standard grid and ½ grid (half grid) intersect, and hence the positions of vias connecting the diagonal wires and orthogonal wires on different wiring layers can be limited to grid points on the standard grid and ½ grid points, thereby enabling simplification of the automatic layout algorithms.

In a preferred embodiment of this second aspect, the minimum wire width of the diagonal wire is substantially identical to the minimum wire width of the orthogonal wire. In this embodiment, the diagonal wires have a substantially identical minimum wire width and a substantially identical minimum wiring pitch to the orthogonal wires, and hence the wiring density of the diagonal wires can be increased to become approximately equal to the wiring density of the orthogonal wires.

BRIEF DESCRIPTION OF THE DRAWINGS

FIG. 3 is a view showing the constitution of a connection point illustrated in Japanese Unexamined Patent Application Publication 2001-142931;

FIG. 5 is a view showing a via figure in the first embodiment;

DESCRIPTION OF THE PREFERRED EMBODIMENTS

Embodiments of the present invention will be described below with reference to the drawings. However, the scope of protection of the present invention is not limited to the following embodiments, and extends to inventions described within the scope of the claims, equivalents thereof, and so on.

Figure 1:
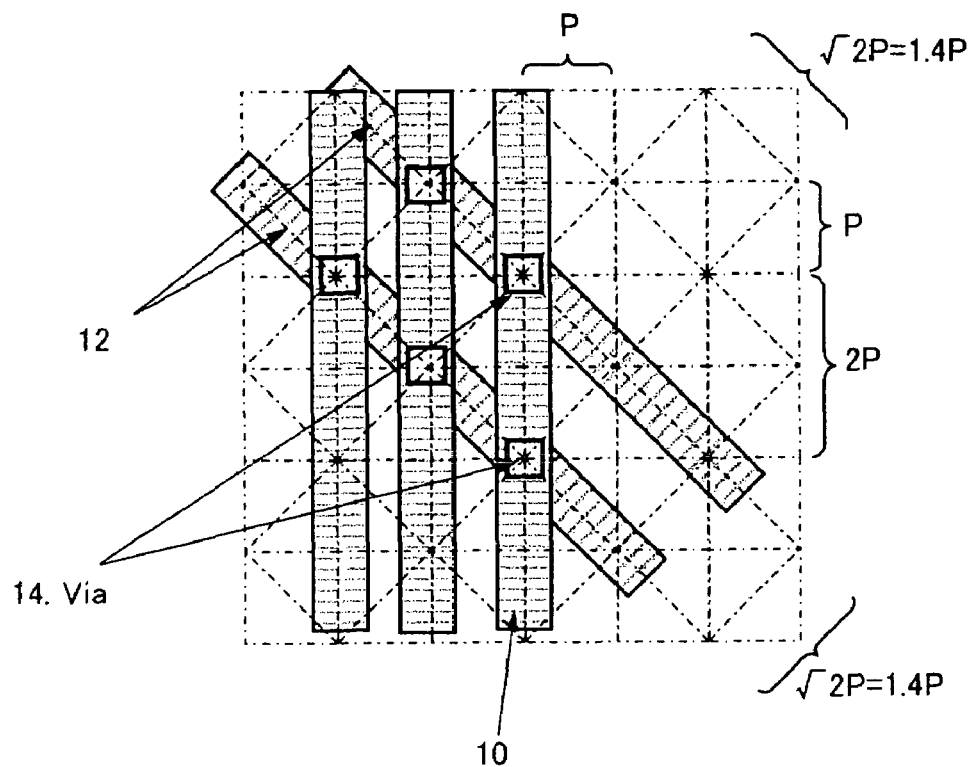
FIG. 1 is a view showing an example of diagonal wiring proposed in Japanese Unexamined Patent Application Publication 2000-82743.

As shown in FIG. 1, in the architectures of Japanese Unexamined Patent Application Publication 2000-82743 and Japanese Unexamined Patent Application Publication 2001-142931, as described above, the wire width of the diagonal wires is set at $\sqrt{2}$ of the width W of the horizontal and vertical wires, and the pitch of the diagonal wires is set at $\sqrt{2}$ of the pitch P of the standard wiring grid, causing a problem in that the wiring density of the diagonal wires decreases. In other words, although the wire width W of the horizontal and vertical wires is set to the minimum wire width in accordance with the circuit design, and accordingly the pitch P of the standard wiring grid is set to the minimum pitch in accordance with the circuit design, the diagonal wiring cannot correspond to this minimum wire width and minimum pitch, causing a great deal of waste in the wiring density.

Figure 14:
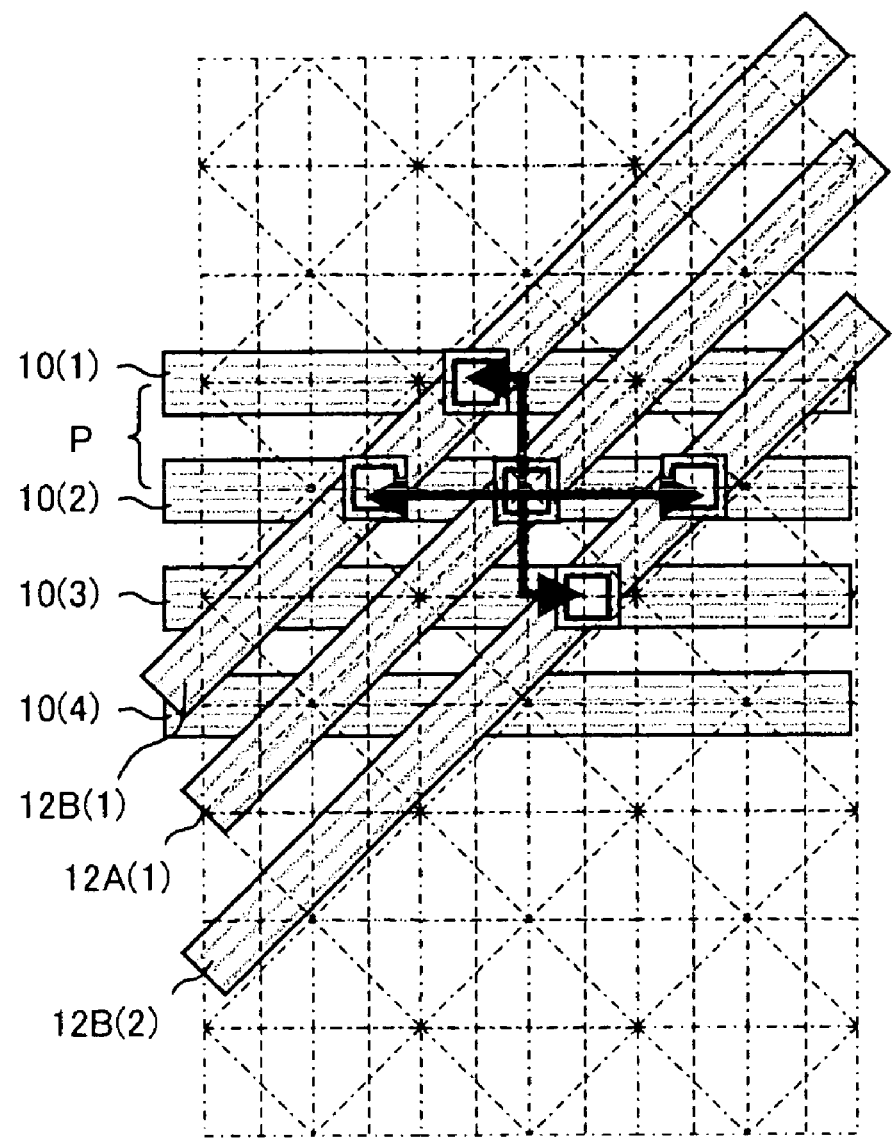
FIG. 14 is a view showing an example of the disposal of diagonal wiring in this embodiment.

FIG. 3 is a view showing the constitution of the connection point illustrated in Japanese Unexamined Patent Application Publication 2001-142931, as described above. In FIG. 3A, a via FIG. 14 is formed in the position at which a vertical wire 10 formed on a lower layer and a diagonal wire 12 formed on an upper layer intersect. The constitution of this via figure can be broken down into the lower layer wire 10 in FIG. 3B, the upper layer wire 12 in FIG. 3C, and the via FIG. 14 in FIG. 3D. The via FIG. 14 is further constituted by a lower layer via cushion conductive layer 14A, an upper layer via cushion conductive layer 14B, and a via 14C which connects the conductive layers 14A, 14B.

According to Japanese Unexamined Patent Application Publication 2001-142931, the lower layer via cushion conductive layer 14A is formed in a square shape having the same wire width W as the lower layer wire 10, and the upper layer via cushion conductive layer 14B is formed in a square shape having the same wire width $\sqrt{2}$ W as the upper layer wire 12. In so doing, a position-aligning margin is ensured on both sides of the width V of the via 14C. Hence, in the architecture according to Japanese Unexamined Patent Application Publication 2001-142931, as described above, the wire width of the diagonal wires increases, and as a result the wiring density cannot be increased. This makes large-scale integration difficult.

FIG. 4 is a view showing a wiring configuration in a first embodiment. FIG. 4A shows an orthogonal wire 10 extending in a vertical direction, a diagonal wire 12 having a 45° or 135° incline in relation to the orthogonal wire 10, and a via FIG. 14 provided at the point of intersection therebetween. In this embodiment, the diagonal wire 12 has a minimum wire width of W, which is equal to the minimum wire length W of the orthogonal wire 10 extending in a vertical or horizontal direction. Moreover, the size of the via FIG. 14, which is provided in the intersection position of the orthogonal wire 10 and diagonal wire 12 formed respectively on different wiring layers, is equal to or less than the minimum wire width W of the orthogonal wire 10.

Figure 4A:
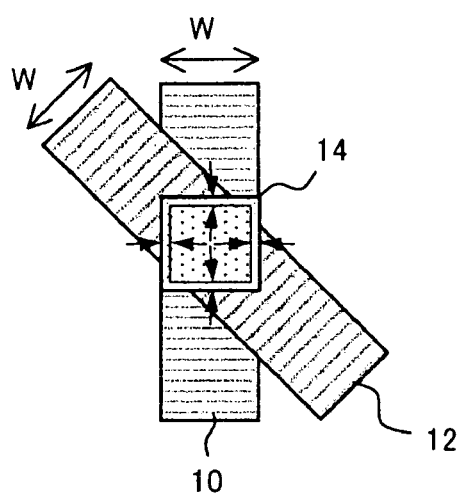
FIG. 4 is a view showing a wiring configuration in a first embodiment.
Figure 4B:
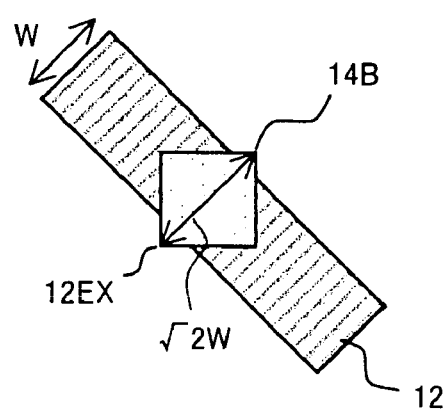
Figure 4D:
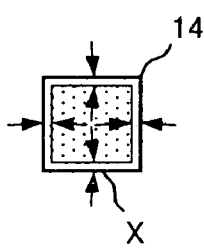
Figure 4C:
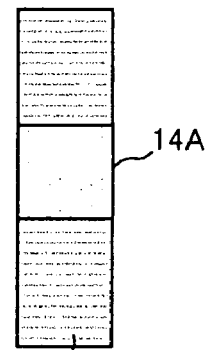
Figure 4C:
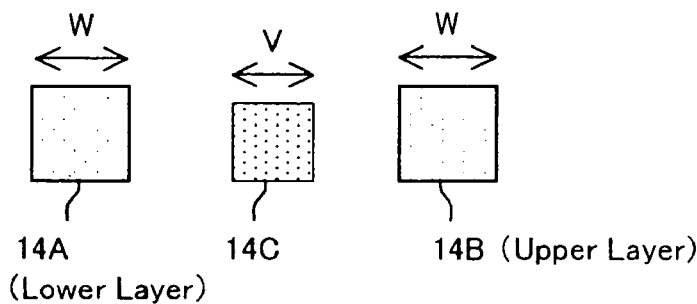
Figure 6A:
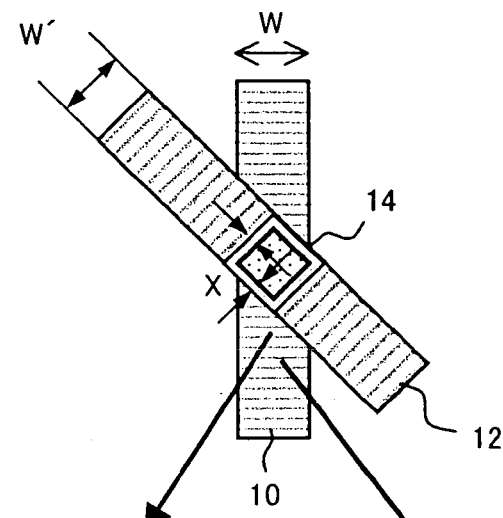
FIG. 6 is a view showing another via figure in the first embodiment.
Figure 6B:
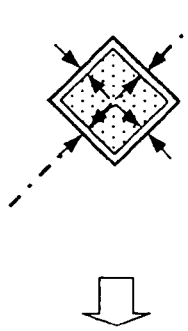
Figure 6D:
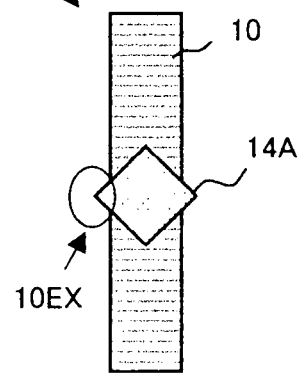
Figure 6C:
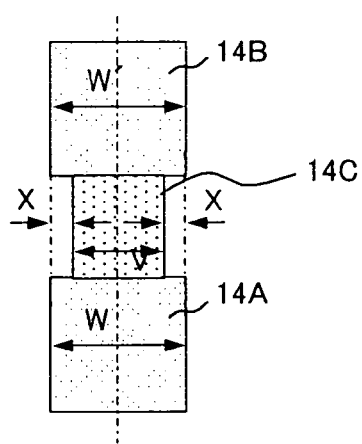

FIG. 4B shows the diagonal wire 12, FIG. 4C shows the orthogonal wire 10, and FIG. 4D shows the via FIG. 14. As shown in the exploded view in FIG. 4D, the via FIG. 14 is constituted by a via 14C having a size V which is smaller than the wire width W, and a lower layer side via cushion conductive layer 14A and upper layer side via cushion conductive layer 14B which are connected to the via 14C. The via 14C is rectangular, and preferably square-shaped, and the two via cushion conductive layers 14A, 14B take a similar rectangular form in a larger size. The length of one edge of the rectangular form of the via 14C is set to V (<W) in relation to the wire width W, and V+2X, which is a length obtained by adding a position-aligning margin X on the periphery thereof to the size V of the via 14C, is set to be equal to the wire width W of the orthogonal wire 10 (V+2X=W). One edge of the via cushion conductive layers 14A, 14B is set to V+2X. In the example in FIG. 4, the lower layer via cushion conductive layer 14A is disposed in the same direction as the orthogonal wire 10, and hence the direction of the upper layer via cushion conductive layer 14B is inclined by 45° to the diagonal wire 12.

Note that the via FIG. 14 is a virtual figure used for automatic layout, and in a semiconductor integrated circuit device, the via cushion conductive layers 14A, 14B are formed as actual wires integrated with the orthogonal wire 10 and diagonal wire 12 respectively. More specifically, during automatic layout, data for the orthogonal wire 10 are formed in the lower layer conductive layer, and data for the diagonal wire 12 are formed in the upper layer conductive layer. Then, data for the via FIG. 14 are added to the point of intersection between the orthogonal wire 10 and diagonal wire 12. The data for the via FIG. 14 are constituted by the data for the via cushion conductive layers 14A, 14B and data for the via 14C. Accordingly, when the data for the via FIG. 14 are added, the lower layer via cushion conductive layer 14A is integrated with the lower layer orthogonal wire 10 (see FIG. 4C), and the upper layer via cushion conductive layer 14B is integrated with the upper layer diagonal wire 12 (see FIG. 4B).

Since the via FIG. 14 is set to the size described above, the form of the orthogonal wire 10 formed in the same direction as the via cushion conductive layers 14A, 14B maintains the minimum wire width W. As regards the form of the diagonal wire 12, which is inclined by 45° to the via cushion conductive layers 14A, 14B, an enlarged wire width region 12EX having a partially enlarged wire width W is formed by the via cushion conductive layer 14B in the position of overlap with the orthogonal wire 10. This enlarged wire width region 12EX has an enlarged wire width of $\sqrt{2}$ W in relation to the wire width W. As a result, even when the minimum wire width W of the diagonal wire 12 is set to be equal to the minimum wire width W of the orthogonal wire 10 and the via 14C is provided so as to conform to the wire width W of the orthogonal wire 10, the via cushion conductive layer 14B can be provided in a manner which ensures an appropriate position-aligning margin X between the diagonal wire 12 and the via 14C. In other words, the wire width of the diagonal wires does not have to be increased to $\sqrt{2}$ W as shown in FIG. 3, and thus the wiring pitch of the diagonal wires can be narrowed, enabling an increase in the wiring density of the diagonal wires.

FIG. 5 is a view showing another via figure in the first embodiment. In FIG. 5A, the via FIG. 14 is provided in the intersection position between the lower layer orthogonal wire 10 and upper layer diagonal wire 12, similarly to FIG. 4A. FIG. 5B is an enlarged view thereof, and FIG. 5C is a sectional view in the horizontal direction of the via FIG. 14. As shown in the sectional view, the via FIG. 14 is constituted by a via cushion conductive layer 14A positioned on the same lower layer as the orthogonal wire 10, a via cushion conductive layer 14B positioned on the same upper layer as the diagonal wire 12, and a via 14C connecting the via cushion conductive layers 14A, 14B. The via 14C has a rectangular form such as a square, and one edge thereof has a length of V. In relation thereto, the length of one edge of the via cushion conductive layers 14A, B is set to V+2X, which is obtained by adding a margin X to the two sides of the via 14C. This length V+2X of the via cushion conductive layers 14A, 14B is designed to be equal to the wire width W.

In the example in FIG. 5, the direction of the via FIG. 14 matches the direction of the orthogonal wire 10, and accordingly, as shown in FIG. 5D, the via cushion conductive layer 14B is added to the diagonal wire 12 so that an enlarged wire width region 12EX having a partially enlarged wire width is formed on the diagonal wire 12.

FIG. 6 is a view showing another via figure in the first embodiment. In this example, the direction of the via FIG. 14 matches the direction of the diagonal wire 12. Accordingly, when the via cushion conductive layer 14A is added, an enlarged wire width region 10 EX having a partially enlarged wire width is formed on the orthogonal wire 10. Hence, no enlarged wire width region is formed on the diagonal wire 12 even when the via cushion conductive layer 14B is added. Other constitutions are identical to the example in FIG. 5.

As described above, the orthogonal wire and diagonal wire are both set to the minimum wire width W or a substantially equal width thereto, the via size V of the via FIG. 14 is set to or below the minimum wire width W, and preferably below the minimum wire width W by the margin X, so that the via FIG. 14 is kept to the wire width of one of either the orthogonal wire or the diagonal wire. Note, however, that problems that the size in the direction of incline (the diagonal line direction) of the via figure increases beyond the wire width of the other wire, have been solved by forming the enlarged wire width region having a partially enlarged wire width on the other wire. Since a partially enlarged wire width region is provided only in positions where a via is formed such that the diagonal wire is held at the minimum wire width W, the minimum pitch of the diagonal wires can be narrowed, enabling an increase in the wiring density of the diagonal wires.

Figure 7:
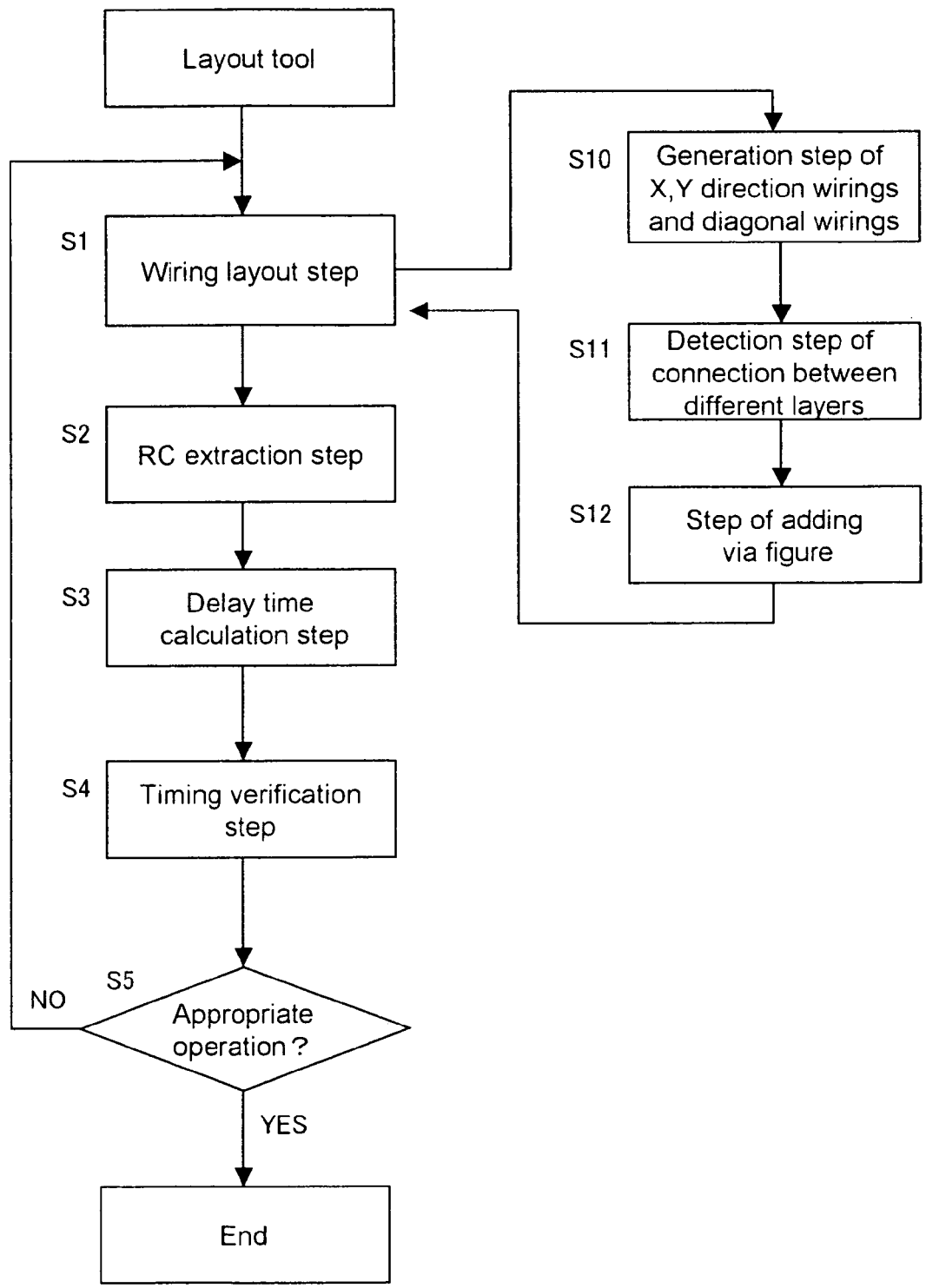
FIG. 7 is a flowchart of wiring layout in the first embodiment.

FIG. 7 is a flowchart of wiring layout in the first embodiment. Netlist data generated by logic design are provided to a computer installed with a wiring layout tool, and thus an automatic wiring program of the wiring layout tool performs layout of the connection wires connecting the circuit elements included in the netlist (S1). In this wiring layout step, for example, X direction wiring data and, according to necessity, diagonal wire data are generated on a first wiring layer, and Y direction wiring data and, according to necessity, diagonal wire data are generated on a second wiring layer which is different from the first wiring layer (S10). In this state, the wiring layout tool generates the respective wiring data. The required connection positions between the first and second wiring layers are then detected (S11), and data for the via figure described in FIG. 5 are added to these connection positions (S12). As described above, the via figure is constituted by a via cushion conductive layer on the X direction or Y direction orthogonal wire side, a via cushion conductive layer on the diagonal wire side, and a via connecting the via cushion conductive layers. The same via figure is added in cases where diagonal wires formed on different wiring layers are connected to each other. With the addition of the via figure, the aforementioned enlarged wire width region is produced on a part of the diagonal wire.

Once the wiring data for connecting the circuit elements have been generated in the automatic layout step S1, a resistance component R and a capacitance component C pertaining to the generated wires are extracted (S2). The resistance component R is mainly dependent on the width and length of the wires, and the capacitance component C is mainly dependent on the parasitic capacitance between the wires and the peripheral conductive layers to the top, bottom, left, and right. Once the resistance component R and capacitance component C of the wires have been determined in the RC extraction step S2, the delay time of each wire is calculated (S3), and timing verification of the LSI produced by the wiring layout operation is performed (S4). In this timing verification step, checks are made as to whether or not an appropriate operation is possible when an output signal of a certain gate is supplied to the input terminal of the next gate over the delay time of the wire that is connected to the output terminal of the certain gate, and so on. To perform the timing verification step S4, the delay time of each wire must be extracted in advance.

If confirmation of normal operations cannot be provided in the timing verification step S4, the process is repeated from the wiring layout step S1. If it is confirmed that the LSI is operating normally, the layout process ends.

By using the via figure described above, the via which connects the diagonal wire and orthogonal wire can be made in an appropriate connecting state even when the minimum wire width of the diagonal wire and the minimum wire width of the orthogonal wire are made equal. Further, by making the minimum wire widths of the diagonal wire and orthogonal wire equal, the wiring density of the diagonal wires can be made equal to the wiring density of the orthogonal wires. In other words, the minimum pitch of the diagonal wires can be made approximately equal to the minimum pitch of the orthogonal wires.

Figure 8:
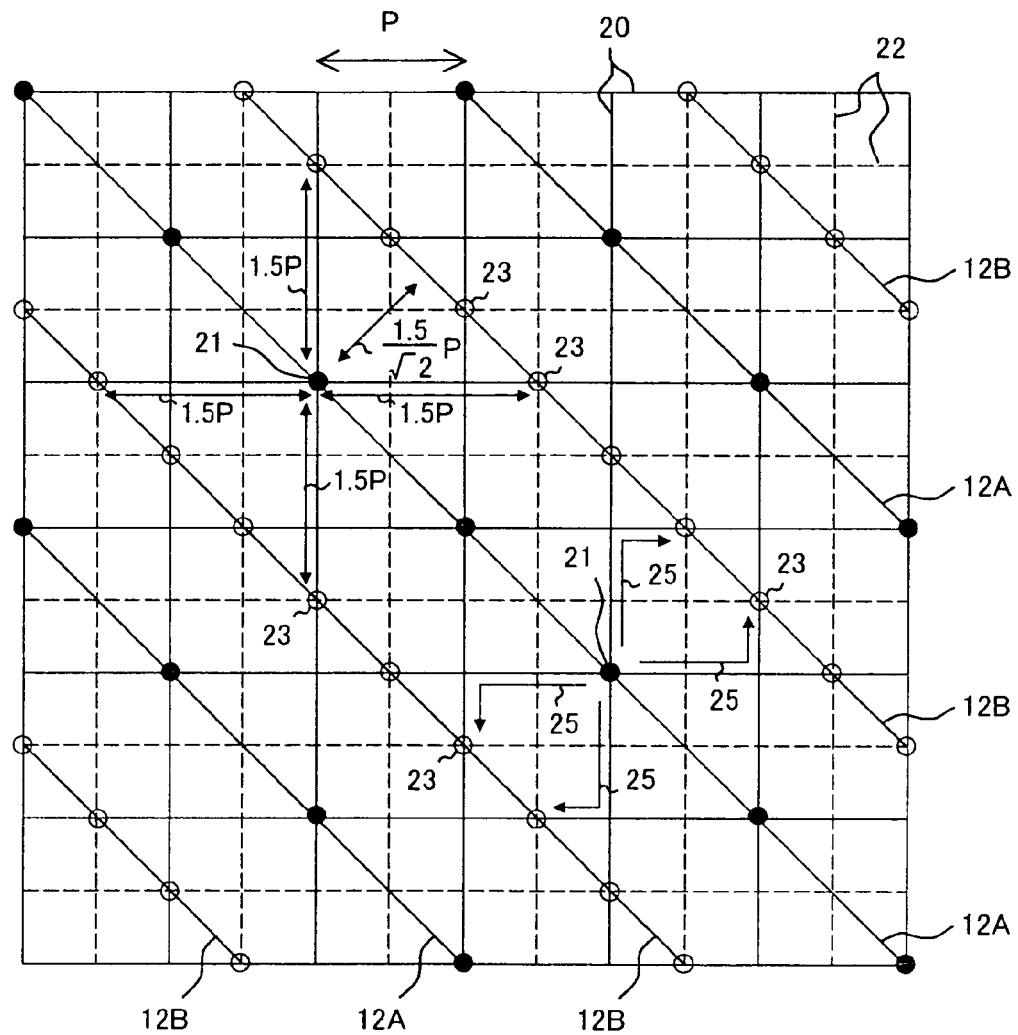
FIG. 8 is a view illustrating a layout architecture of diagonal wiring in this embodiment.

FIG. 8 is a view illustrating a layout architecture of diagonal wires in a second embodiment. FIG. 8 shows a standard grid 20 (the solid lines in the drawing) extending in a horizontal direction (X direction) and a vertical direction (Y direction) on which orthogonal wires are disposed, and a ½ grid 22 (the dotted lines in the drawing) having a pitch P/2 which is half the pitch P of the standard grid 20. In this embodiment, the diagonal wires are inclined by 45° or 135° in relation to the orthogonal wires. Furthermore, the diagonal wires comprise first diagonal wires 12A disposed on grid points 21 (the black circles in the drawing) of the standard grid 20, and second diagonal wires 12B disposed on ½ grid points 23 (the white circles in the drawing) at which the standard grid 20 (the solid line grid) and ½ grid 22 (the dotted line grid) intersect. The minimum pitch of the diagonal wires 12A, 12B is set to $(1.5/\sqrt{2}) \times P$ of the pitch P. In other words, the pitch of the diagonal wires is at least $(1.5/\sqrt{2}) \times P$.

Figure 2:
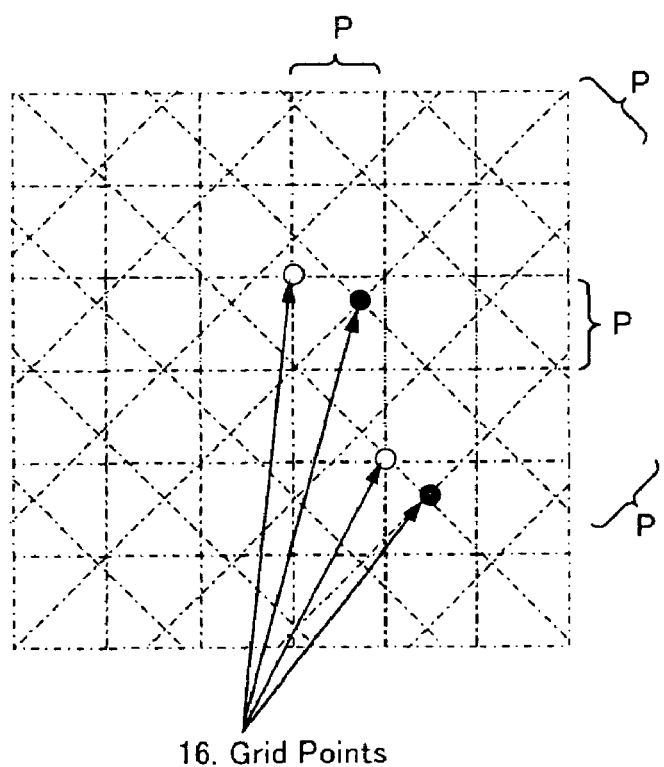
FIG. 2 is a view showing a gridless architecture.

In FIG. 8, all of the diagonal wires are disposed at the minimum pitch, and hence the first diagonal wires 12A and second diagonal wires 12B are disposed alternately. The first diagonal wires 12A are disposed on the grid points 21 of the standard grid 20, and thus when the first diagonal wires are disposed in series, the pitch thereof becomes $\sqrt{2}$ P. Likewise, the second diagonal wires 12B are disposed on the ½ grid points 23, and thus when the second diagonal wires are disposed in series, the pitch thereof also becomes $\sqrt{2}$ P. If the first diagonal wires 12A and second diagonal wires 12B are disposed alternately, however, the pitch thereof becomes $(1.5/\sqrt{2}) \times P = 1.06$ P, which is substantially equal in length to the minimum pitch P of the orthogonal wires. Moreover, the positions at which the orthogonal wires and diagonal wires intersect are only on the grid points 21 or ½ grid points 23, and hence match the positions at which a via figure may be generated, enabling a simplification of the layout algorithms. In other words, a gridless architecture such as that shown in FIG. 2 is not produced.

According to the diagonal wiring layout architecture in FIG. 8, when the diagonal wires 12 are disposed at the minimum wire width $(1.5/\sqrt{2}) \times P$, the disposal positions of the via FIGS. formed between the diagonal wires 12 and orthogonal wires have the following relationships. Firstly, the first diagonal wires 12A intersect the orthogonal wires at the grid points 21 of the standard grid, and therefore via figures are disposed in positions on the grid points 21. Further, the second diagonal wires 12B adjacent to the first diagonal wires intersect the same orthogonal wires in positions apart from the grid points 21 at which the first diagonal wires 12A and orthogonal wires intersect, as described above, by 1.5 P in the X and Y directions. In other words, the grid points 21 illustrated by black circles and the ½ grid points 23 illustrated by white circles, which are adjacent to the grid points 21 in the horizontal direction or vertical direction, have a pitch of 1.5 P. The black-circle grid points 21 and adjacent white-circle grid points 23 are also disposed in positions of a knight's move 25 in chess in the X and Y directions. In other words, the vias between the first diagonal wires 12A and orthogonal wires and the vias between the second diagonal wires 12B and orthogonal wires are disposed at a pitch of 1.5 P in the horizontal and vertical directions, and in the diagonal direction are disposed in the positions of the knight's moves 25. The knight's move position is defined by moving a distance P in the X or Y direction, and then moving a distance P/2 in an orthogonal direction thereto.

By means of the diagonal wiring layout architecture shown in FIG. 8, the minimum pitch of the diagonal wires can be made substantially identical (1.06 P) to the minimum pitch P of the orthogonal wires, and thus the wiring density of the diagonal wires can be increased to approximately that of the orthogonal wires. Moreover, the positions of the via figures can be limited to positions on the grid points 21 and ½ grid points 23.

Note that orthogonal wires may be disposed on the ½ grid 22 as well as the standard grid 20. In this case, the orthogonal wires intersect the first diagonal wires 12A at the grid points of the ½ grid 22, and hence via figures are disposed in these positions. The orthogonal wires intersect the second diagonal wires 12B at the ½ grid points 23.

If the wiring layout tool of FIG. 7 is designed on the basis of the diagonal wiring layout architecture shown in FIG. 8, the diagonal wires are laid out at a minimum pitch of 1.06 P in the automatic wiring layout step S1, thereby increasing the wiring density of the diagonal wires.

Figure 9:
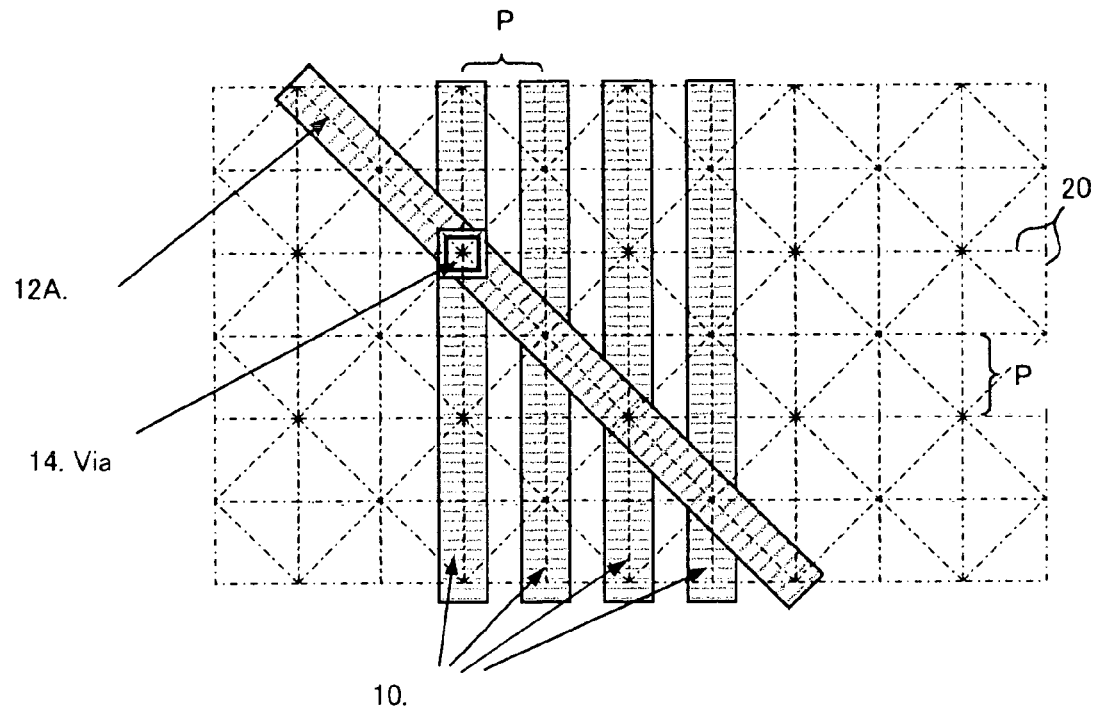
FIG. 9 is a view illustrating the disposal of diagonal wiring according to the diagonal wiring layout architecture of this embodiment.
Figure 10:
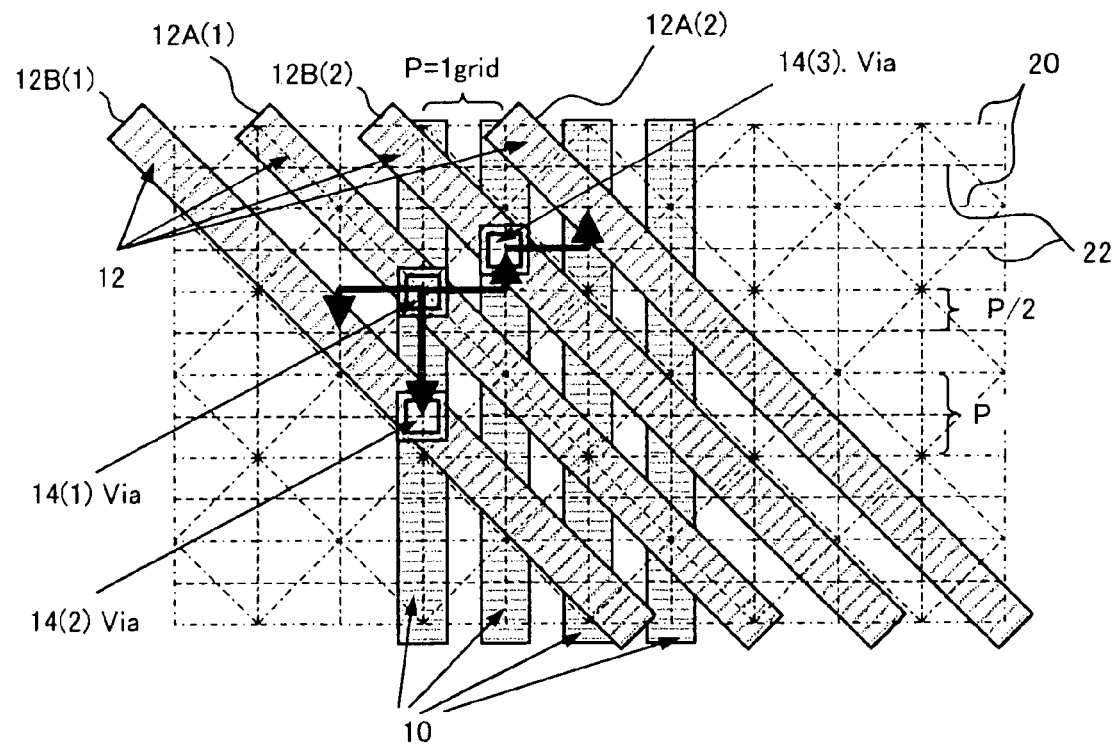
FIG. 10 is a view illustrating the disposal of diagonal wiring according to the diagonal wiring layout architecture of this embodiment.

FIGS. 9, 10 are views illustrating the disposal of diagonal wires according to the diagonal wiring layout architecture in this embodiment. In FIG. 9, a plurality of orthogonal wires 10 are disposed on the vertical lines of the standard grid 20 (dot/dash lines), and a diagonal wire 12A is generated in an upper layer position. The diagonal wire corresponds to a first diagonal wire disposed on a grid point of the standard grid 20, and is therefore connected to the Y direction orthogonal wire 10 by a via FIG. 14 disposed on the grid point.

FIG. 10 shows the standard grid (dot/dash lines) 20 and a horizontal direction ½ grid (broken lines) 22 displaced by P/2, which is half the grid pitch P of the standard grid 20. Other diagonal wires 12B(1), 12B(2), and 12A(2) are disposed adjacent to the first diagonal wire 12A(1) shown in FIG. 9 at the minimum pitch.

The first diagonal wire 12A(1) and the orthogonal wire 10 disposed furthest to the left are connected by a via 14(1) on a grid point. The second diagonal wire 12B(1) therebelow and the orthogonal wire 10 furthest to the left may be connected by a via 14(2) positioned at a distance of 1.5 P from the via 14(1). In other words, the adjacent second diagonal wire 12B(1) may be disposed so as to intersect the orthogonal wire 10 furthest to the left at a distance of 1.5 P from the via 14(1).

The second diagonal wire 12B(2) adjacent to the first diagonal wire 12A(1) in the vertical direction is disposed in a position at which a connection is possible with the orthogonal wire immediately to the right of the leftmost orthogonal wire 10 by means of a via 14(3) positioned a knight's move from the via 14(1). The first diagonal wire 12A(2) adjacent to the second diagonal wire 12B(2) in the vertical direction is disposed in a position at which a connection may be made using a via positioned a knight's move from the via 14(3).

By disposing the first diagonal wires 12A on the grid points of the standard grid 20 and disposing the second diagonal wires 12B on the ½ grid points as shown in FIG. 10, the minimum pitch of the diagonal wires can be made approximately equal (1.06 P) to the minimum pitch P of the orthogonal wires, and thus the wiring density of the diagonal wires can be made approximately equal to the wiring density of the orthogonal wires. Further, although enlarged wire width regions are produced on the diagonal wires 12 where the via figures are generated, the positions of adjacent via figures are related in the form of knight's moves as described above, and hence the enlarged wire width regions have substantially no adverse effect on the minimum wire pitch.

Figure 11:
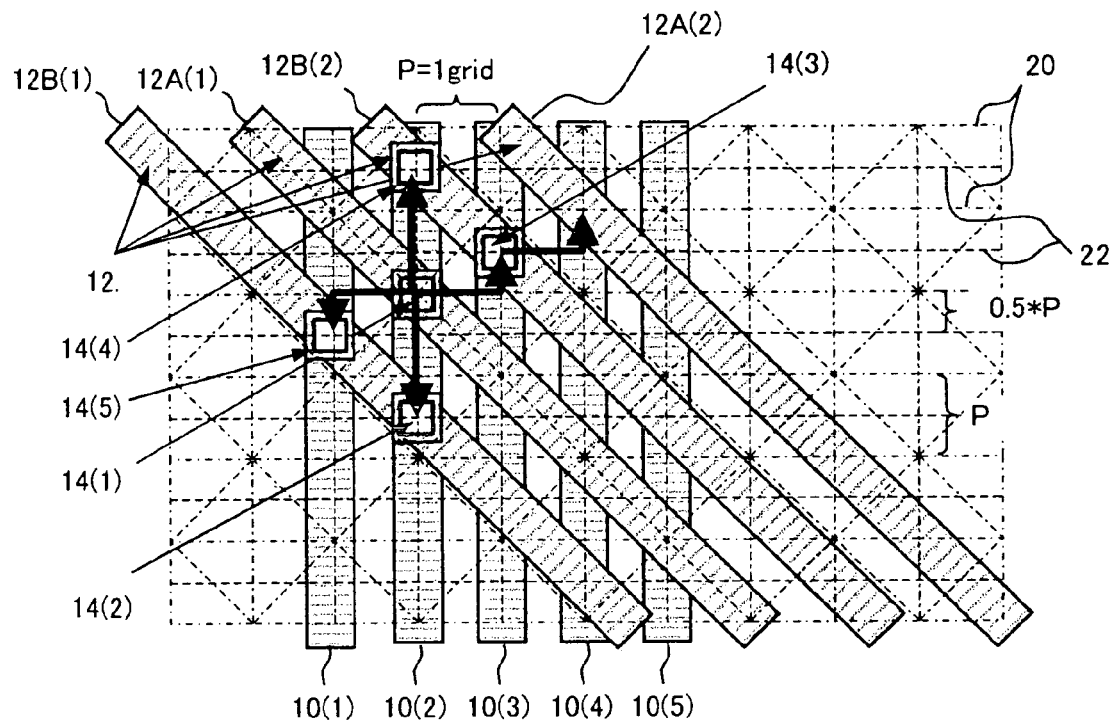
FIG. 11 is a view showing an example of the disposal of diagonal wiring in this embodiment.

FIG. 11 is a view showing an example of diagonal wire disposal in this embodiment. Similarly to FIG. 10, the example in FIG. 11 illustrates the relationships of a plurality of Y direction orthogonal wires 10(1) to 10(5) with a plurality of diagonal wires 12A(1), 12A(2), 12B(1), 12B(2). Centering on a via 14(1) between the diagonal wire 12A(1) and the orthogonal wire 10(2), the intersection positions of the adjacent diagonal wires 12B(1), 12B(2) with the orthogonal wire 10(2) are at a distance of 1.5 P from the via 14(1), as shown by vias 14(2), 14(4). The intersection positions of the adjacent diagonal wires 12B(1), 12B(2) with the adjacent orthogonal wires 10(1), 10(3) are knight's moves from the via 14(1), as shown by vias 14(3), 14(5).

Figure 12:
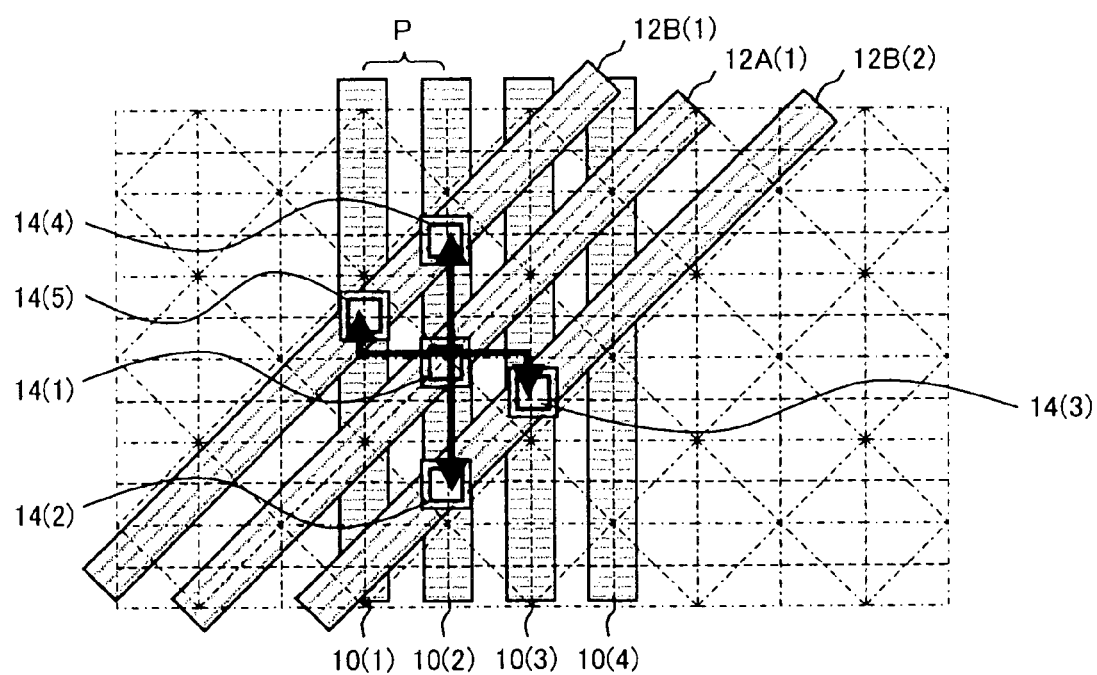
FIG. 12 is a view showing an example of the disposal of diagonal wiring in this embodiment.

FIG. 12 is a view showing an example of diagonal wire disposal in this embodiment. In this example, rightward-rising diagonal wires 12A(1), 12B(1), 12B(2) intersect a plurality of Y direction orthogonal wires 10(1) to 10(4). Likewise in this case, the orthogonal wire 10(2) and the first diagonal wire 12A(1) may be connected by a via 14(1) on a grid point. The adjacent second diagonal wires 12B(1), 12B(2) intersect and may be connected to the orthogonal wire 10(2) in positions 14(2), 14(4) apart from the via 14(1) by a distance of 1.5 P. Further, the second diagonal wires 12B(1), 12B(2) intersect and may be connected to the orthogonal wires 10(1), 10(3) in a position 14(3) apart from the via 14(1) by a knight's move. By disposing adjacent diagonal wires in such intersecting positions, the intersecting positions may be set on the grid points and ½ grid points, and hence the wiring pitch of the diagonal wires may be narrowed, enabling an increase in the wiring density.

Figure 13:
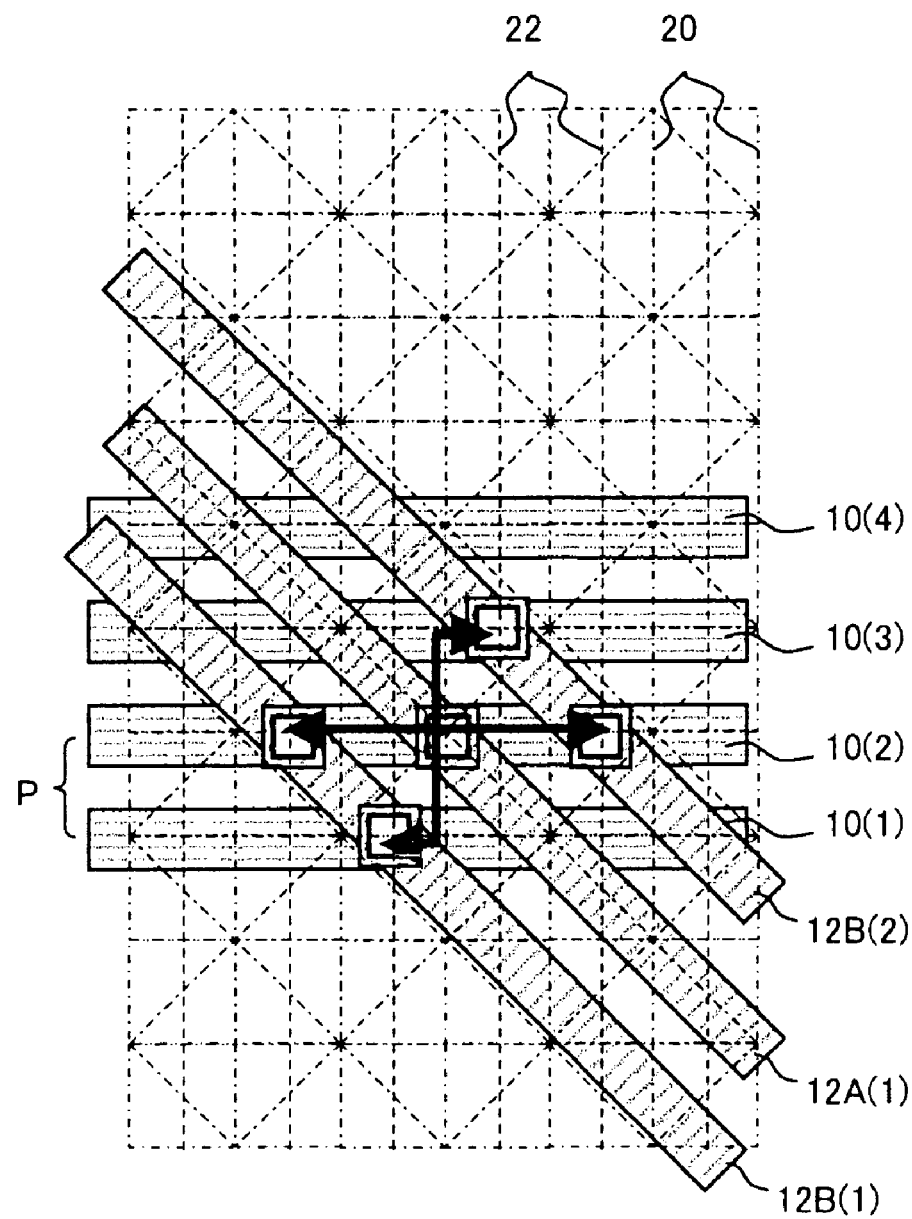
FIG. 13 is a view showing an example of the disposal of diagonal wiring in this embodiment.

FIGS. 13 and 14 are views showing examples of diagonal wire disposal in this embodiment. In these examples, diagonal wires intersect X direction orthogonal wires 10(1) to 10(4). In both cases, the vias of the adjacent second diagonal wires 12B(1), 12B(2) are apart from the intersection position of the orthogonal wire 10(2) and first diagonal wire 12A(1) by distances of 1.5 P in the left and right directions, and by upward and downward knight's moves. The relationship between these intersection positions is as illustrated in FIGS. 11 and 12.

Figure 15:
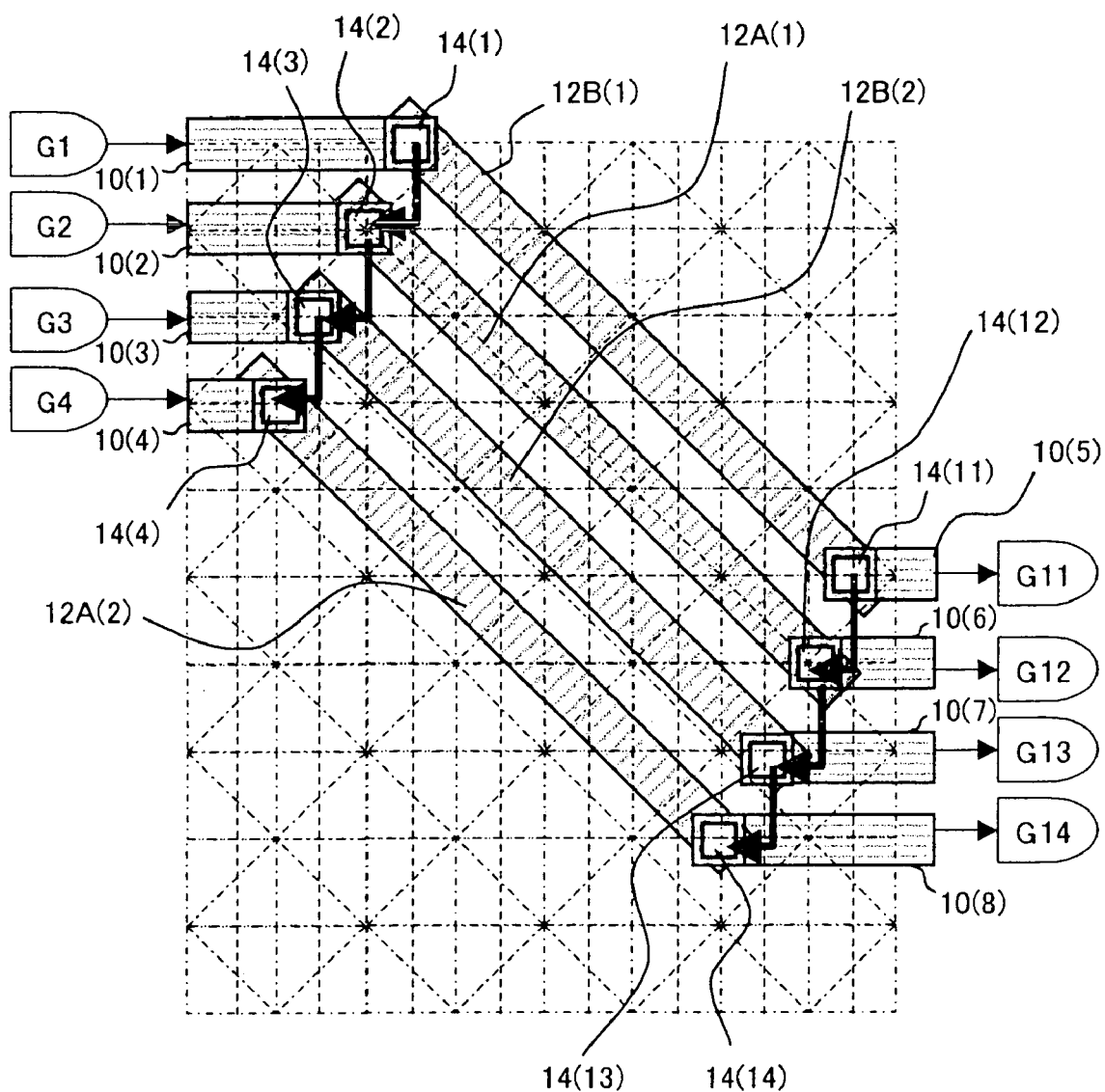
FIG. 15 is a view showing an example of wiring layout using diagonal wiring according to this embodiment.

FIG. 15 is a view showing an example of wiring layout using diagonal wires according to this embodiment. In this example, the outputs of gates G1 through G4 are connected to the inputs of gates G11 through G14 respectively, and diagonal wires are used as the connection wires therefor. The gates G1 and G11 are connected by a wire comprising an X direction orthogonal wire 10(1), a via 14(1), a second diagonal wire 12B(1), a via 14(11), and an orthogonal wire 10(5). Similarly, the gates G2 and G12 are connected by a wire comprising an orthogonal wire 10(2), a via 14(2), a first diagonal wire 12A(1), a via 14(12), and an orthogonal wire 10(6), the gates G3 and G13 are connected by a wire comprising an orthogonal wire 10(3), a via 14(3), a second diagonal wire 12B(2), a via 14(13), and an orthogonal wire 10(7), and the gates G4 and G14 are connected by a wire comprising an orthogonal wire 10(4), a via 14(4), a first diagonal wire 12A(2), a via 14(14), and an orthogonal wire 10(8).

As shown in FIG. 15, the vias of adjacent diagonal wires and X direction orthogonal wires are positioned at knight's moves from one another (14(1) to 14(4) and 14(11) to 14(14) in the drawing).

Figure 16:
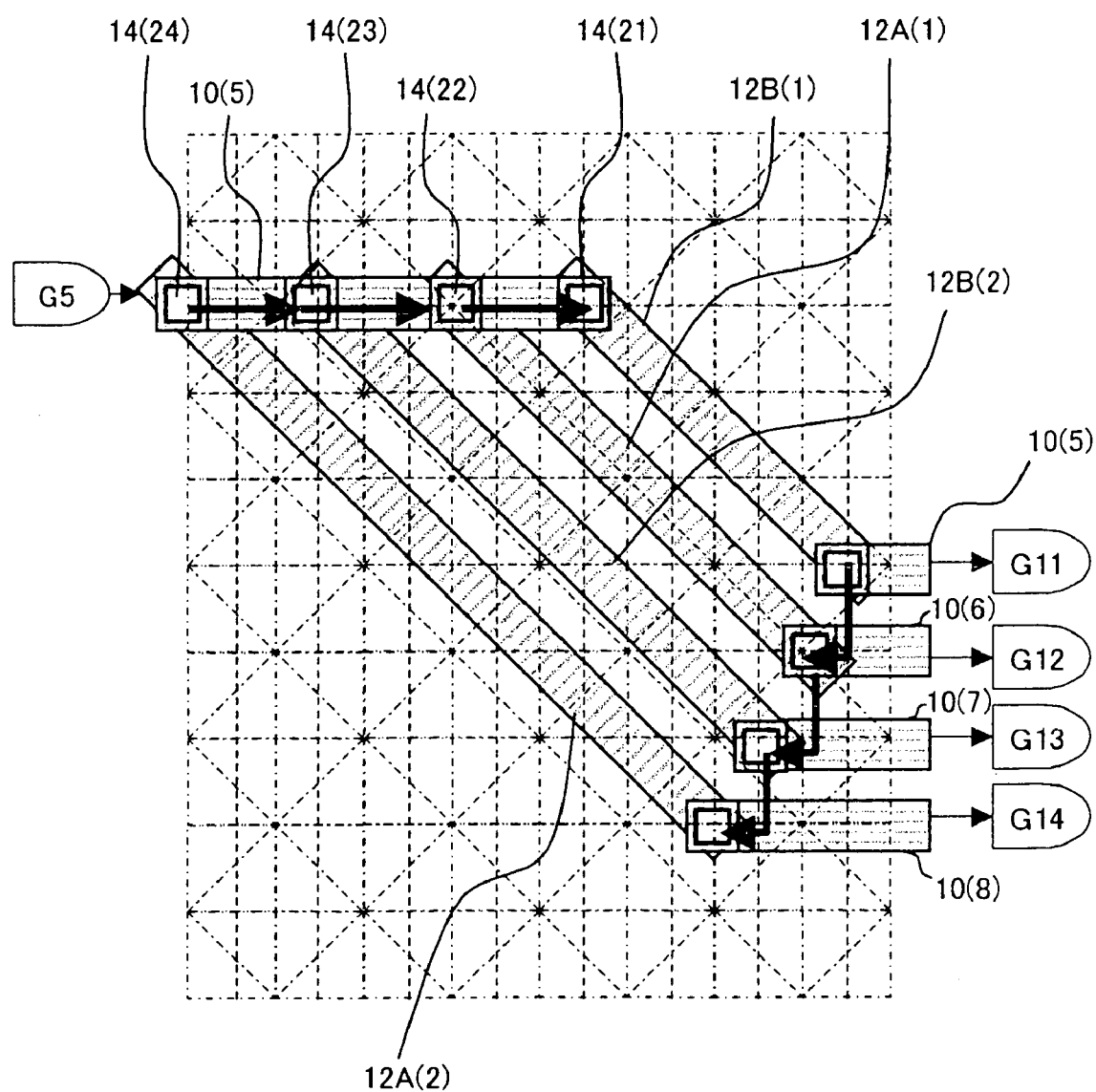
FIG. 16 is a view showing an example of wiring layout using diagonal wiring according to this embodiment.

FIG. 16 is a view showing an example of wiring layout using diagonal wires according to this embodiment. In this example, the output of a gate G5 is connected to each of the inputs of gates G11 through G14, and diagonal wires are used as the connection wires therefor. More specifically, the output of the gate G5 is connected to the input of the gate G11 from an orthogonal wire 10(5) through a via 14(21), a diagonal wire 12B(1), and an orthogonal wire 10(5). The output of the gate G5 is connected to the inputs of the other gates G12, G13, and G14 by similar wires. In this example, the orthogonal wire 10(5) and adjacent diagonal wires 12B(1), 12A(1), 12B(2) 12A(2) are connected by vias 14(21) through 14(24) at a pitch of 1.5 P.

The wiring pitch of the diagonal wires in FIGS. 15 and 16 is a narrow 1.06 P, enabling the wiring density of the diagonal wires to be increased and gates to be connected over a small area. When the pitch of the diagonal wires is set at √2 P, as shown in FIG. 1, the wiring density decreases, and a larger area than that in FIGS. 15, 16 is required for the gate-connecting wires, as can be understood from FIGS. 15 and 16.

Figure 17:
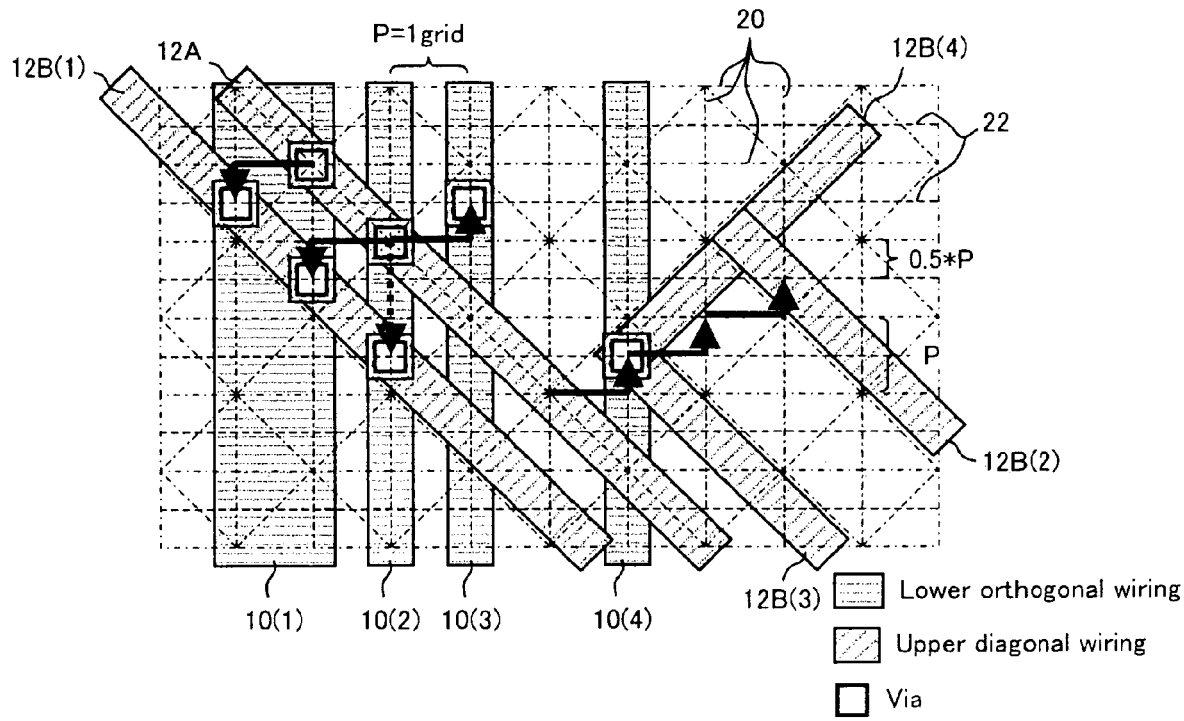
FIG. 17 is a view showing an example of wiring layout using diagonal wiring according to this embodiment.

FIG. 17 is a view showing an example of wiring layout using diagonal wires according to this embodiment. In this example, Y direction orthogonal wires 10(1) through 10(4) are provided on the lower layer side, and diagonal wires 12A, 12B(1) through 12(4) are provided on the upper layer side. The upper layer diagonal wires combine leftward-rising wires and rightward-rising wires. Further, the wire width of the orthogonal wire 10(1) is large, and the via figures connecting the first diagonal wire 12A and second diagonal wire 12B(1) to the orthogonal wire 10(1) are disposed on a grid point of the standard grid 20 and a ½ grid point of the ½ grid 22 respectively. The second diagonal wires 12B(3) and 12B(2) are apart from each other by a distance of twice the minimum pitch (1.06 P) The vias of the adjacent diagonal wires on the same orthogonal wire 10(2) are disposed at a pitch of 1.5 P, and the adjacent vias in the right angle direction to the orthogonal wire 10(2) are apart by knight's moves.

Figure 18:
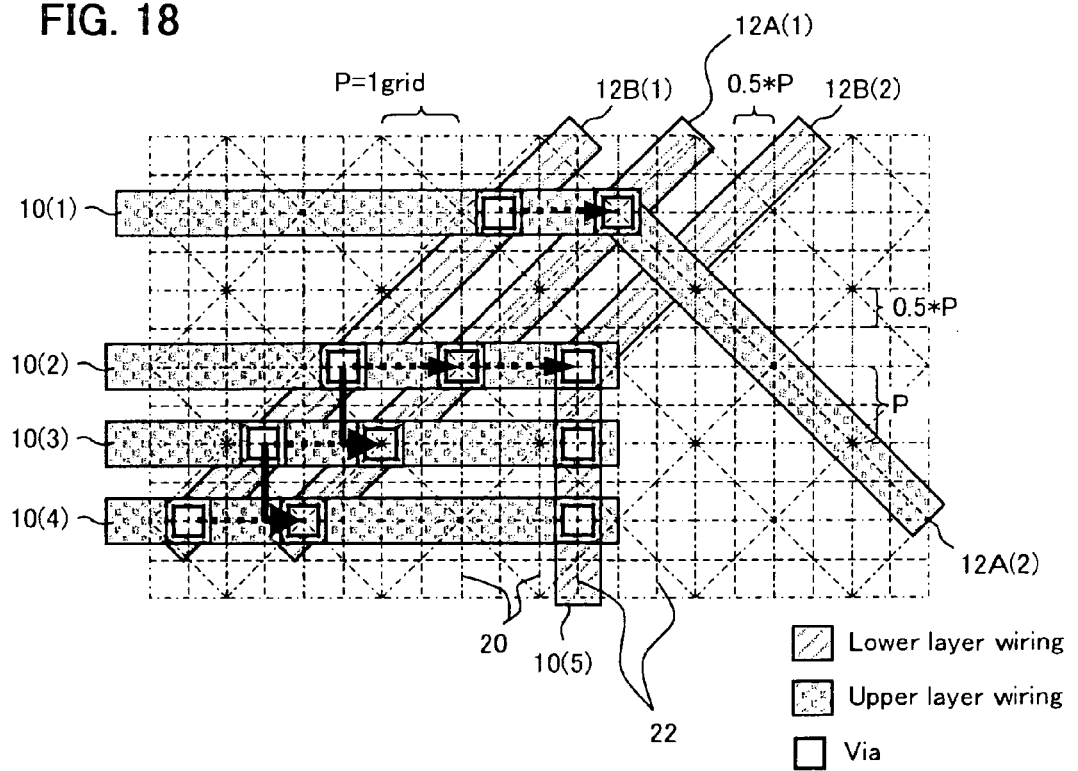
FIG. 18 is a view showing an example of wiring layout using diagonal wiring according to this embodiment.

FIG. 18 is a view showing an example of wiring layout using diagonal wires according to this embodiment. In this example, diagonal wires 12A(1), 12A(2), and 12B(1), 12B(2) are provided on the lower layer side, and orthogonal wires 10(1) through 10(4) extending in the X direction and an orthogonal wire 10(5) extending in the Y direction are provided on the upper layer side. In this example, the vias of adjacent diagonal wires on the same orthogonal wire are disposed at a pitch of 1.5 P. Furthermore, the orthogonal wire 10(5) which is connected to the second diagonal wire 12B(2) is disposed on the ½ grid 22. Thus orthogonal wires may be disposed on the ½ grid 22 as well as on the standard grid 20.

Figure 19:
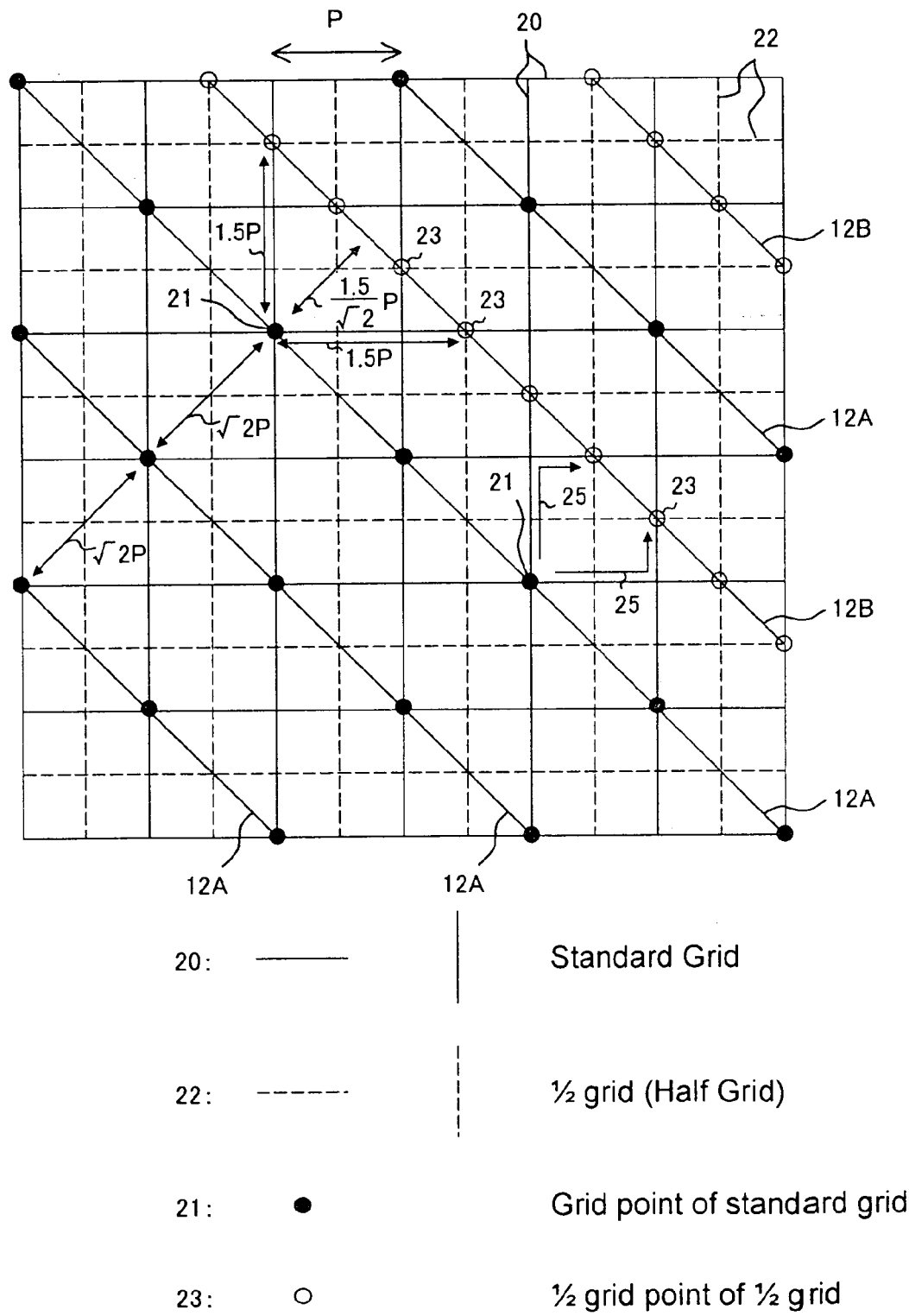
FIG. 19 is a view showing a modified example of a diagonal wiring layout architecture according to a second embodiment.

FIG. 19 is a view showing a modified example of a diagonal wiring layout architecture according to a second embodiment. In the example in FIG. 8, the diagonal wires 12A, 12B are disposed at a pitch of (1.5/√2)×P, but in FIG. 19, a diagonal wire group disposed at a pitch of (1.5/√2)×P is mixed together with a diagonal wire group disposed at a pitch of √2 P, as shown in FIG. 1. In other words, in the second embodiment, rather than excluding diagonal wires disposed on the grid points 21 of the standard grid as shown in FIG. 1, diagonal wires on the grid points of the standard grid may be combined with diagonal wires disposed on the grid points of the ½ grid, and further diagonal wires disposed at a pitch of (1.5/√2)×P may be combined with diagonal wires disposed at a pitch of √2 P.

According to the present invention as described above, by adding via figures having sufficient via cushion conductive layering, appropriate connection margins can be ensured, and thus the wire width of the diagonal wires can be narrowed. Furthermore, the minimum pitch of the diagonal wires can be made substantially equal to the minimum pitch of the orthogonal wires while limiting the position of the vias to grid points and ½ grid points.

What is claimed is:

1. A wiring layout method for a semiconductor integrated circuit device having a plurality of circuit elements and a plurality of wires connecting the circuit elements, comprising:
    generating data for an orthogonal wire having a first minimum wire width, which is formed in a first wiring layer and extends horizontally or vertically;
    generating data for a diagonal wire having a second minimum wire width which is substantially equal to said first minimum wire width, formed in a second wiring layer which differs from said first wiring layer and extending in a diagonal direction in relation to said orthogonal wire; and
    generating data for a via figure at point at which said orthogonal wire and said diagonal wire overlap, said via figure being constituted by a via having a size which is no greater than said first or second minimum wire width, a first via cushion conductive layer which is larger than said via and formed in said first wiring layer, and a second via cushion conductive layer which is larger than said via and formed in said second wiring layer,
    wherein said first or second via cushion conductive layer is larger than the minimum wire width of said orthogonal wire or said diagonal wire.

2. The layout method for a semiconductor device according to claim 1, wherein said via has a first rectangular form in which a length of one edge is shorter than said first minimum wire width, and said first and second via cushion conductive layers have a second rectangular form which is larger than said first rectangular form, the second rectangular form is provided in the same direction as one of said diagonal wire and said orthogonal wire, and the other of said diagonal wire and said orthogonal wire includes an enlarged wire width region having a wire width which is enlarged beyond said first or second minimum wire width by said first or second via cushion conductive layer.

3. The layout method for a semiconductor device according to claim 1, wherein said via has a first rectangular form in which a length of one edge is shorter than said first minimum wire width, and said first and second via cushion conductive layers has a second rectangular form which is larger than said first rectangular form, the second rectangular form is provided in the same direction as said orthogonal wire, and said diagonal wire includes an enlarged wire width region having a wire width which is enlarged beyond said second minimum wire width by said second via cushion conductive layer.

4. A semiconductor device wiring layout program for causing a computer to execute a wiring layout procedure for a semiconductor integrated circuit having a plurality of circuit elements and a plurality of wires connecting the circuit elements, said wiring layout procedure comprising:
    generating data for an orthogonal wire having a first minimum wire width, which is formed in a first wiring layer and extends horizontally or vertically;
    generating data for a diagonal wire having a second minimum wire width which is substantially equal to said first minimum wire width, formed in a second wiring layer which differs from said first wiring layer and extending in a diagonal direction in relation to said orthogonal wire; and
    generating data for a via figure at point at which said orthogonal wire and said diagonal wire overlap, said via figure being constituted by a via having a size which is no greater than said first or second minimum wire width, a first via cushion conductive layer which is larger than said via and formed in said first wiring layer, and a second via cushion conductive layer which is larger than said via and formed in said second wiring layer,
    wherein said first or second via cushion conductive layer is larger than the minimum wire width of said orthogonal wire or said diagonal wire.

* * * * *